(12) United States Patent
Ichikawa et al.

(10) Patent No.: US 12,510,818 B2
(45) Date of Patent: Dec. 30, 2025

(54) REFLECTIVE MASK BLANK AND REFLECTIVE MASK

(71) Applicant: TEKSCEND PHOTOMASK CORP., Tokyo (JP)

(72) Inventors: Kenjiro Ichikawa, Tokyo (JP); Ayumi Goda, Tokyo (JP); Hideaki Nakano, Tokyo (JP)

(73) Assignee: TEKSCEND PHOTOMASK CORP., Tokyo (JP)

( * ) Notice: Subject to any disclaimer, the term of this patent is extended or adjusted under 35 U.S.C. 154(b) by 561 days.

(21) Appl. No.: 17/923,212

(22) PCT Filed: May 12, 2021

(86) PCT No.: PCT/JP2021/018089
§ 371 (c)(1),
(2) Date: Nov. 3, 2022

(87) PCT Pub. No.: WO2021/230297
PCT Pub. Date: Nov. 18, 2021

(65) Prior Publication Data
US 2023/0176467 A1    Jun. 8, 2023

(30) Foreign Application Priority Data

May 14, 2020 (JP) .................................. 2020-085399

(51) Int. Cl.
*G03F 1/24* (2012.01)
*G03F 1/48* (2012.01)
(Continued)

(52) U.S. Cl.
CPC .................. *G03F 1/24* (2013.01); *G03F 1/48* (2013.01); *G03F 1/54* (2013.01); *G03F 1/60* (2013.01); *G03F 1/80* (2013.01); *G03F 7/004* (2013.01)

(58) Field of Classification Search
CPC ................. G03F 1/24; G03F 1/48; G03F 1/54
See application file for complete search history.

(56) References Cited

U.S. PATENT DOCUMENTS 8,288,062 B2    10/2012    Hayashi et al.
11,067,886 B2    7/2021    Komizo et al.
(Continued)

FOREIGN PATENT DOCUMENTS

EP    3650936 A1    5/2020
EP    3882698 A1    9/2021
(Continued)

OTHER PUBLICATIONS

Machine translation of JP 2019-139085 (no date) (Year: 0000).*
(Continued)

*Primary Examiner* — Amanda C. Walke
(74) *Attorney, Agent, or Firm* — Squire Patton Boggs (US) LLP (57) ABSTRACT

There are provided a reflective mask blank in which a fine absorption film pattern is formed even when a high-absorbent material is used as an absorption film of an EUV mask, whereby the shadowing effect can be reduced and electron beam repair etching can be performed and a reflective mask blank for producing the same. A reflective mask blank (10) according to this embodiment includes: a substrate (1); a multi-layer reflective film (2) reflecting an EUV light having a multi-layer structure formed on the substrate (1); a capping layer (3) protecting the multi-layer reflective film (2) formed on the multi-layer reflective film (2); and an absorption film (4) absorbing the EUV light formed on the capping layer (3), in which the absorption film (4) contains 50% by atom or more of elements constituting at least one of tin oxide (SnO) and indium oxide (InO) and contains a material easy to be etched by a fluorine-based gas or a chlorine-based gas.

10 Claims, 6 Drawing Sheets

(51) Int. Cl.
*G03F 1/54* (2012.01)
*G03F 1/60* (2012.01)
*G03F 1/80* (2012.01)
*G03F 7/004* (2006.01)

(56) References Cited

U.S. PATENT DOCUMENTS

| | | | |
|---|---|---|---|
| 11,294,270 B2 * | 4/2022 | Fukugami | .................. G03F 1/48 |
| 2012/0107733 A1 | 5/2012 | Hayashi et al. | |
| 2013/0100428 A1 * | 4/2013 | Ruoff | ........................ G03F 1/22 |
| | | | 430/5 |
| 2018/0031965 A1 * | 2/2018 | Jindal | ........................ G03F 1/60 |
| 2018/0299766 A1 * | 10/2018 | Tanabe | ...................... G03F 1/24 |
| 2020/0159106 A1 | 5/2020 | Fukugami et al. | |
| 2020/0218143 A1 | 7/2020 | Komizo et al. | |

FOREIGN PATENT DOCUMENTS

| | | |
|---|---|---|
| EP | 4145222 A1 | 3/2023 |
| JP | 2004-006798 A | 1/2004 |
| JP | 2007-207829 A | 8/2007 |
| JP | 2015-073013 A | 4/2015 |
| JP | 2019-056898 A | 4/2019 |
| JP | 2019-139085 A | 8/2019 |
| SG | 11202205357 R | 7/2022 |
| SG | 11202254473 R | 12/2022 |
| WO | WO 1997/044709 A1 | 11/1997 |
| WO | WO 2011/004850 A1 | 1/2011 |
| WO | WO 2019/009211 A1 | 1/2019 |
| WO | WO 2019/009212 A1 | 1/2019 |
| WO | WO 2020/100632 A1 | 5/2020 |

OTHER PUBLICATIONS

Search Report and Written Opinion dated Nov. 19, 2024 for Singapore Patent Application No. 11202260133W, 9 pages.
International Search Report mailed Jul. 13, 2021, for International Application No. PCT/JP2021/018089, with translation, 7 pages.
Supplementary Euoprean Search Reported dated May 29, 2024, for European Patent Application No. 21805092.0, 14 pages.
International Preliminary Report on Patentability mailed Nov. 24, 2022, for International Application No. PCT/JP2021/018089, with translation, 6 pages.

\* cited by examiner

REFLECTIVE MASK BLANK AND REFLECTIVE MASK

CROSS-REFERENCE

This application is a National Stage filing under 35 U.S.C. § 371 of International Patent Application No. PCT/JP2021/018089, filed May 12, 2021, which claims the benefit of and priority to Japanese Patent Application No. 2020-085399, filed May 14, 2020, the contents of all of which are hereby incorporated by reference in their entireties for all purposes.

TECHNICAL FIELD

The present invention relates to a reflective mask blank and a reflective mask.

BACKGROUND ART

In a manufacturing process for semiconductor devices, a demand for miniaturization by a photolithography technology has increased with the miniaturization of the semiconductor devices. In the photolithography, the minimum resolution dimension of a transfer pattern largely depends on the wavelength of an exposure light source, and the minimum resolution dimension can be made smaller as the wavelength is shorter. Therefore, in the manufacturing process for semiconductor devices, a conventional exposure light source using an ArF excimer laser light having a wavelength of 193 nm has been replaced with an EUV (Extreme UltraViolet) exposure light source having a wavelength of 13.5 nm.

Since the EUV light has a short wavelength, most substances have high light absorptivity. Therefore, a mask for the EUV (EUV mask) is a reflective photomask unlike a conventional transmissive mask (see PTL 1, PTL 2, for example). PTL 1 discloses, in a reflective exposure mask used for EUV lithography, forming a multi-layer film in which two or more kinds of material layers are periodically deposited on a base substrate and forming, on the multi-layer film, a pattern containing a nitrogen-containing metal film or a mask pattern containing a multi-layer structure of a metal nitride film and a metal film. PTL 2 discloses a reflective EUV mask in which a pattern containing a metal film containing an ion-implanted element is formed as an absorption film on a multi-layer reflective film.

Further, in the EUV lithography, a dioptric system utilizing light transmission cannot be used as described above, and therefore an optical system member of an exposure machine is not a lens but a mirror. This poses a problem that an incident light and a reflected light on an EUV photomask cannot be coaxially designed. Thus, in the EUV lithography, a technique is commonly used which includes making the EUV light incident by tilting the optical axis by 6° from the vertical direction of the EUV mask and guiding a reflected light reflected at an angle of −6° to a semiconductor substrate.

As described above, the optical axis is tilted in the EUV lithography, which has sometimes posed a problem referred to as a so-called "shadowing effect" in which the EUV light incident on the EUV mask creates a shadow of a pattern of the EUV mask (absorption film pattern), resulting in a deterioration of the transfer performance.

To address this problem, PTL 2 discloses a method capable of reducing the shadowing effect by increasing the absorption of the EUV light by ion-implanting a material having a high extinction coefficient k into the absorption film and suppressing the EUV reflectance, and thus achieving a film thickness (60 nm or less) of an absorber layer smaller than that in a conventional one.

For the patterning of a light shielding film in a transmissive photomask, it is general to use dry etching with the progress of miniaturization, and the dry etching is applied to patterning of the absorption film in the EUV mask. However, the material having a high extinction coefficient k to the EUV used in PTL 2 is generally a material having a low dry etching rate. This has posed a problem that the absorption film has poor processability, and a resist serving as an etching mask needs to be thickened, and, as a result, the formation of a fine absorption film pattern by a high-absorbent material is difficult.

Further, when the electron beam repair etching is performed in a defect repair step of a photomask production step, the material having a high extinction coefficient k is a material having an extremely low etching rate and difficult to repair defects, which sometimes poses a serious problem.

CITATION LIST

Patent Literatures

PTL 1: JP 2004-6798 A
PTL 2: JP 2015-73013 A

SUMMARY OF INVENTION

Technical Problem

The present invention has been made to solve the above-described problems. It is an object of the present invention to provide a reflective mask in which a fine absorption film pattern is formed even when a high-absorbent material is used as an absorption film of an EUV mask, whereby the shadowing effect can be reduced and electron beam repair etching can be performed and a reflective mask blank for producing the same.

Solution to Problem

To achieve the above-described object, a reflective mask blank according to one aspect of the present invention includes: a substrate; a reflective film reflecting an EUV light having a multi-layer structure formed on the substrate; a protective film protecting the reflective film formed on the reflective film; and an absorption film absorbing the EUV light formed on the protective film, in which the absorption film contains 50% by atom or more of elements constituting at least one of tin oxide and indium oxide and contains a material easy to be etched by a fluorine-based gas or a chlorine-based gas.

A reflective mask according to one aspect of the present invention includes: a substrate; a reflective film reflecting an EUV light having a multi-layer structure formed on the substrate; a protective film protecting the reflective film formed on the reflective film; and an absorption film absorbing the EUV light formed on the protective film, in which the absorption film contains 50% by atom or more of elements constituting at least one of tin oxide and indium oxide and contains a material easy to be etched by a fluorine-based gas or a chlorine-based gas.

Advantageous Effects of Invention

According to the reflective mask and the reflective mask blank for producing the same according to one aspect of the present invention, the absorption film is used which has a high EUV light absorptivity and which can be dry etched, and therefore a smaller resist film thickness than before can be used and a fine high absorption film pattern can be formed, so that the shadowing effect can be reduced, and a line width error or a pattern displacement can be reduced on a wafer. Further, electron beam repair etching is enabled.

As described above, the reflective mask and the reflective mask blank for producing the same according to one aspect of the present invention can provide a reflective mask in which a fine absorption film pattern is formed even when a high-absorbent material is used as an absorption film of an EUV mask, whereby the shadowing effect can be reduced and electron beam repair etching can be performed and a reflective mask blank for producing the same.

DESCRIPTION OF EMBODIMENTS

Hereinafter, the configurations of a reflective photomask blank and a reflective photomask according to the present invention are described with reference to the drawings.
(Entire Structure)

Figure 1:
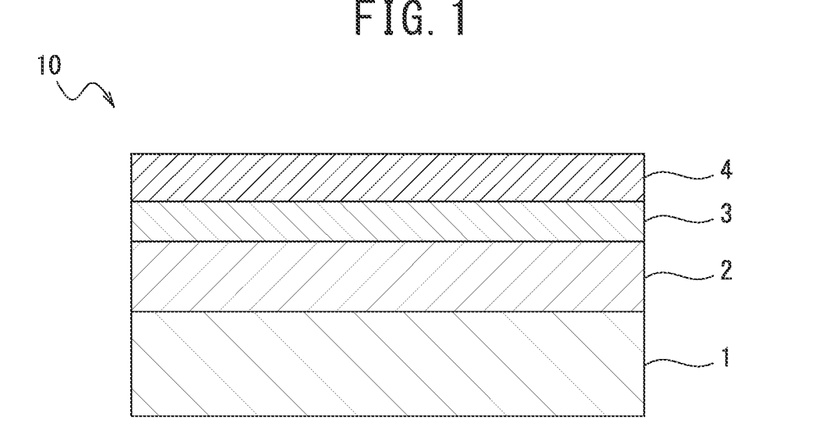
FIG. 1 is a schematic cross-sectional view illustrating the structure of a reflective photomask blank according to an embodiment of the present invention.
Figure 2:
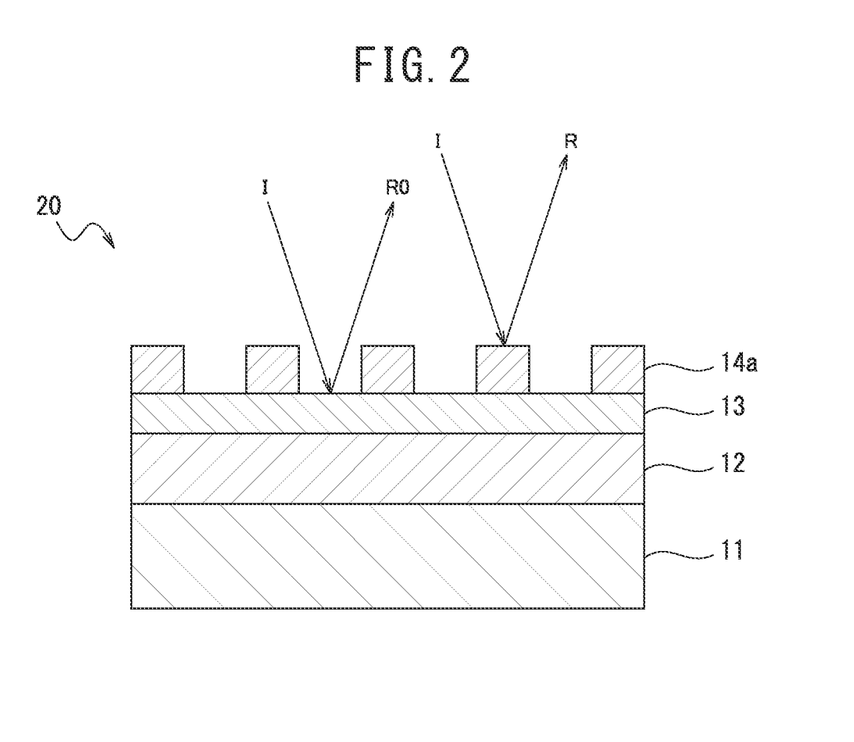
FIG. 2 is a schematic cross-sectional view illustrating the structure of a reflective photomask according to an embodiment of the present invention.

FIG. 1 is a schematic cross-sectional view illustrating the structure of a reflective photomask blank (reflective mask blank) 10 according to an embodiment of the present invention. FIG. 2 is a schematic cross-sectional view illustrating the structure of a reflective photomask (reflective mask) 20 according to the embodiment of the present invention. Herein, the reflective photomask 20 according to the embodiment of the present invention illustrated in FIG. 2 is formed by patterning an absorption film 4 of the reflective photomask blank 10 according to the embodiment of the present invention illustrated in FIG. 1.

As illustrated in FIG. 1, the reflective photomask blank 10 according to the embodiment of the present invention includes a multi-layer reflective film (reflective film) 2 on a substrate 1 and a capping layer (protective layer) 3 on the multi-layer reflective film 2. Thus, the multi-layer reflective film 2 and the capping layer 3 are formed on the substrate 1. The absorption film 4 is provided on the capping layer 3 and the absorption film 4 contains at least one or more layers.
(Substrate)

For the substrate 1 according to the embodiment of the present invention, a flat Si substrate, synthetic quartz substrate, or the like is usable. Further, a low thermal expansion glass added with titanium is usable for the substrate 1. However, the present invention is not limited to the above and any material having a small thermal expansion coefficient may be acceptable.
(Multi-Layer Reflective Film)

The multi-layer reflective film 2 according to the embodiment of the present invention reflects an EUV light (extreme ultraviolet light), which is an exposure light, and contains a combination of materials having significantly different refractive indices to the EUV light. For example, the multi-layer reflective film 2 can be formed by repeatedly depositing a layer containing a combination of Mo (molybdenum) and Si (silicon) or Mo (molybdenum) and Be (beryllium) by about 40 cycles.
(Capping Layer)

The capping layer 3 according to the embodiment of the present invention is formed of a material resistant against dry etching performed in the patter formation of the absorption film 4 and functions as an etching stopper to prevent damage to the multi-layer reflective film 2 in the etching of an absorption film pattern. Herein, the capping layer 3 may not be provided depending on materials of the multi-layer reflective film 2 or etching conditions. Although not illustrated in the drawings, a back surface conductive film can be formed on the surface on which the multi-layer reflective film 2 is not formed of the substrate 1. The back surface conductive film is a film for fixing the reflective photomask 20 utilizing the principle of an electrostatic chuck when the reflective photomask 20 is installed in an exposure machine.

As illustrated in FIG. 2, by removing a part of the absorption film 4 of the reflective photomask blank 10, i.e., by patterning the absorption film 4, an absorption pattern (absorption film pattern 14a) of the reflective photomask 20 is formed. In EUV lithography, the EUV light is obliquely incident and reflected by a reflective film 12, but the transfer performance onto a wafer (semiconductor substrate) sometimes deteriorates due to the shadowing effect in which the absorption film pattern 14a interferes with an optical path. This deterioration of the transfer performance is reduced by reducing the thickness of the absorption film pattern 14a absorbing the EUV light. To reduce the thickness of the absorption film pattern 14a, it is preferable to apply a material having higher absorptivity to the EUV light than that of a conventional material, i.e., a material having a high extinction coefficient k to a wavelength of 13.5 nm.

Figure 3:
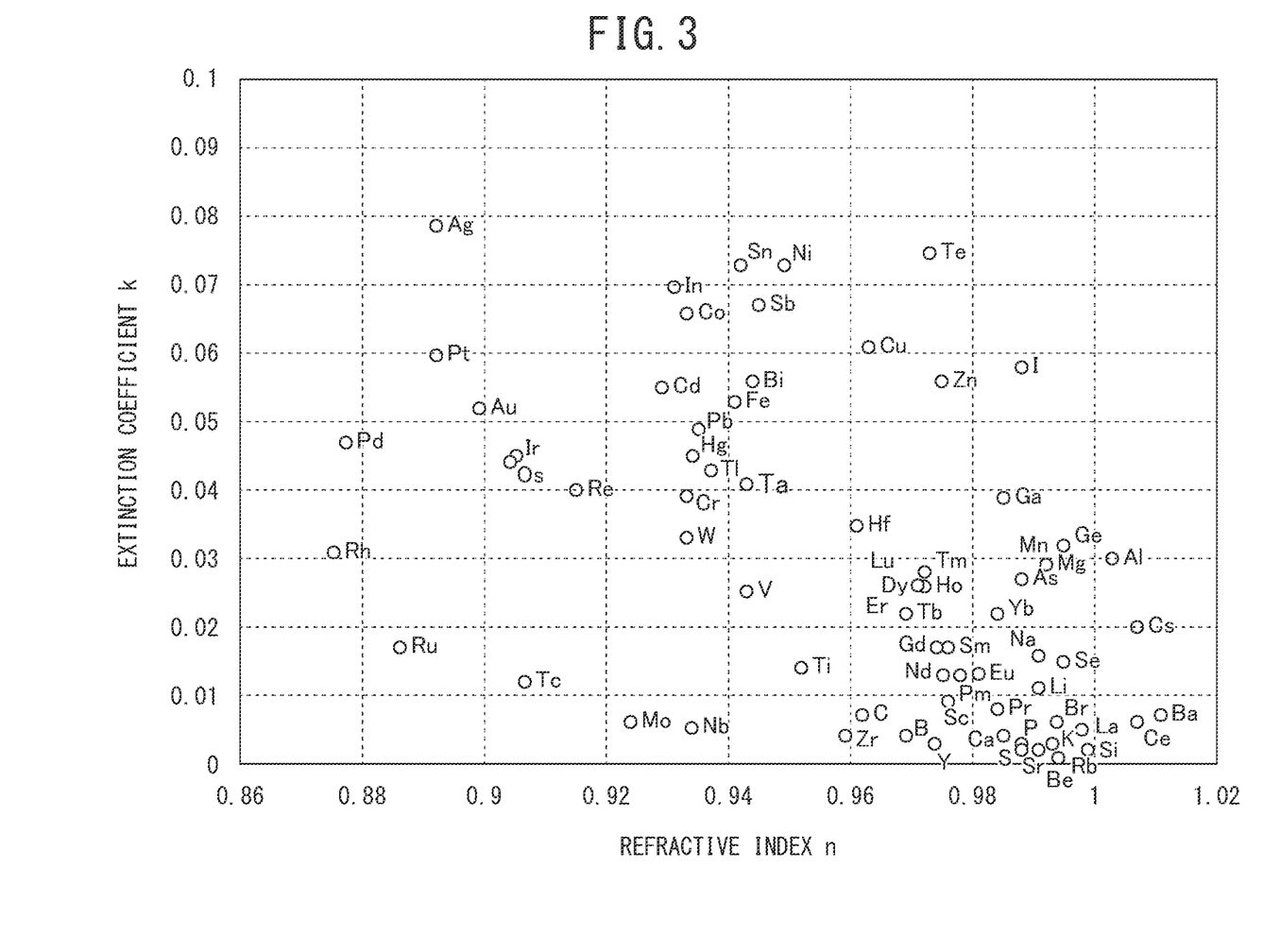
FIG. 3 is a graph illustrating the optical constants of metals at the wavelength of an EUV light.

FIG. 3 is a graph illustrating the optical constant to the wavelength of 13.5 nm of the EUV light of each metal material. The horizontal axis of FIG. 3 represents the refractive index n and the vertical axis represents the extinction coefficient k. The extinction coefficient k of tantalum (Ta), which is a main material of the conventional absorption film 4, is 0.041. Compound materials having a larger extinction coefficient k can reduce the thickness of the absorption film 4 as compared with conventional compound materials. The use of a material having the extinction coefficient k of 0.06 or more as a main component enables a sufficient reduction in the thickness of the absorption film 4 and enables a reduction in the shadowing effect.

As materials satisfying a combination of the optical constants (nk value) described above, silver (Ag), indium (In), tin (Sn), nickel (Ni), tellurium (Te), and the like are present and their extinction coefficients k are within the range of 0.07 to 0.08 as illustrated in FIG. 3. In the case of the materials above, the extinction coefficients k can be significantly increased to about twice the extinction coefficient 0.041 of tantalum (Ta), which is a conventional absorption film material, and therefore high light absorptivity is obtained. However, these high-absorbent materials are difficult to be processed into a mask due to poor dry etching properties (in other words, halides of these elements have low volatility) or have poor practicality as a mask because their melting points are low, and therefore most of them cannot withstand heat in the production of a mask or in EUV exposure.

To avoid such drawbacks, the absorption film 4 of the reflective photomask blank 10 and the absorption film pattern 14a of the reflective photomask 20 according to this embodiment are formed of a tin oxide (SnO) film or an indium oxide (InO) film. A tin (Sn) simple substance or an indium (In) simple substance has a low melting point of around 230° C. and around 160° C., respectively, and has a problem with thermal stability. However, when formed into a tin oxide (SnO) film or an indium oxide (InO) film, the melting points thereof can be significantly increased. When a plurality of tin oxide (SnO) films was actually produced by reactive sputtering, and their melting points were measured with a thermal analyzer, it was found that the tin oxide (SnO) film had a melting point of 1630° C. and the indium oxide (InO) film had a melting point of 1910° C., which were higher than that of the simple substances thereof.

The tin oxide (SnO) film and the indium oxide (InO) film are chemically stable, and therefore tend to be hard to be etched by a fluorine-based gas (for example, an etching gas containing fluorine, such as a $CF_4$ gas or an $SF_6$ gas) or a chlorine-based gas (for example, an etching gas containing chlorine, such as a $Cl_2$ gas or an HCl gas) which is generally used in dry etching. In this case, the dry etching rate is low, and therefore it is necessary to thicken a resist formed on the absorption film 4, and as a result, it tends to be difficult to form the fine absorption film pattern 14a.

To address the problem, by individually mixing materials having characteristics of being easy to be etched by a fluorine-based gas or a chlorine-based gas to the tin oxide (SnO) film or the indium oxide (InO) film, the etching rate when using a fluorine-based gas or a chlorine-based gas can be improved. This makes it possible to reduce the thickness of the film thickness of the resist on the absorption film 4, and as a result, it is possible to reduce the difficulty of forming the fine absorption film pattern 14a by high-absorbent materials.

In general, the dry etching causes etching by the generation of reactive ions dissociated into active radicals or various forms due to collision of an introduced gas with electrons in plasma. The etching is more likely to occur with an increase in volatile products having low boiling points formed on the etching surface. The index therefor is the boiling point or the vapor pressure of a reaction product formed by a material to be etched and an introduced gas. More specifically, a reaction product having a lower boiling point is vaporized to be increased in vapor pressure, and thus is more likely to be exhausted.

The definitions of "easy to be etched" and "hard to be etched" described above in the etching of the absorption film 4 of the reflective photomask blank 10 are described below.

A case of being easy to be etched by a chlorine-based gas means that the boiling point of at least one chlorine-based compound generated by etching is 250° C. or less. A case of being hard to be etched by a chlorine-based gas means that the boiling point of a chloride in the form which can be stoichiometrically taken generated by etching is 300° C. or higher. The same applies also to a fluorine-based gas.

The absorption film 4 provided in the reflective photomask blank 10 and the absorption film pattern 14a provided in the reflective photomask 20 according to the embodiment of the present invention are tin oxide (SnO) films or indium oxide (InO) films containing a mixed material easy to be etched by a fluorine-based gas or a chlorine-based gas and are films in which the atomic number ratio of the mixed material to tin oxide (SnO) or indium oxide (InO) is within the range of more than 0% and 45% or less. More specifically, the absorption film 4 and the absorption film pattern 14a are films having an atomic number ratio of tin oxide (SnO) or indium oxide (InO) of more than 50% and less than 100%. In the case of a compound material having the atomic number ratio of tin oxide (SnO) or indium oxide (InO) within the range above, the refractive index which is the optical constant to the EUV light hardly changes. The extinction coefficient k changes depending on the atomic number ratio, but, for the absorption film 4 (absorption film pattern 14a), a film thickness of 45 nm or less and an EUV reflectance of 3% or less can be achieved. Thus, the tin oxide (SnO) film or the indium oxide (InO) containing the mixed material easy to be etched by a fluorine-based gas or a chlorine-based gas obtains higher light absorptivity than that of tantalum (Ta) which is an existing absorption film forming material.

In fact, a plurality of tin oxide (SnO) film samples containing silicon (Si) in which the content of tin oxide (SnO) is within the range of more than 50% and less than 100% and the content of each metal is changed is produced, and the reflectance at the EUV light wavelength (13.5 nm) is measured. Then, the EUV reflectance of 3% or less can be achieved with a film thickness smaller than the film thickness (about 60 nm) of an existing tantalum (Ta) absorption film.

More specifically, the reflective mask blank 10 according to this embodiment includes: the substrate 1; the reflective film 2 reflecting the EUV light having a multi-layer structure formed on the substrate 1; the capping layer 3 protecting the reflective film 2 formed on the reflective film 2; and the absorption film 4 absorbing the EUV light formed on the capping layer 3, in which the absorption film 4 contains 50% by atom or more of elements constituting at least one of tin oxide (SnO) and indium oxide (InO) and contains a material easy to be etched by a fluorine-based gas or a chlorine-based gas.

The reflective mask 20 according to this embodiment includes: a substrate 11; the reflective film 12 reflecting the EUV light having a multi-layer structure formed on the substrate 11; a capping layer 13 protecting the reflective film 12 formed on the reflective film 12; and the absorption film pattern 14a absorbing the EUV light formed on the capping layer 13, in which the absorption film pattern 14a contains 50% by atom or more of elements constituting at least one of tin oxide (SnO) and indium oxide (InO) and contains a material easy to be etched by a fluorine-based gas or a chlorine-based gas.

As materials mixed with the absorption film 4 (absorption film pattern 14a), materials are desirably used which are easy to be etched by a fluorine-based gas or a chlorine-based gas, i.e., substances in which the boiling point of a fluorine-based compound or a chlorine-based compound is low, to realize the above-described etching process. More specifically, as materials to be mixed with the absorption film 4 (absorption film pattern 14a), it is desirable to select substances in which the boiling point further decreases in a fluorinated or chlorinated state.

Table 1 shows the boiling points of tin (Sn) and indium (In) suitable as an absorbent (main component) of the reflective photomask 20 according to this embodiment and halogen-based compounds of metals suitable as materials to be mixed. The numerical values in Table 1 are a summary of values found in various literatures (CRC Handbook of Chemistry and Physics, 97th Edition (2016), for example) and websites. As shown in Table 1, mixed materials easy to be etched by a fluorine-based gas are desirably silicon, antimony, iridium, osmium, rhenium, tungsten, germanium, arsenic, vanadium, selenium, molybdenum, and tantalum. Mixed materials easy to be etched by a chlorine-based gas are desirably silicon, chromium, germanium, arsenic, vanadium, titanium, tantalum, aluminum, and the like. Further, oxides, nitrides, oxynitrides, or boron nitrides of these mixed materials may be used. As an etching gas, a mixed gas of a fluorine-based gas and a chlorine-based gas may be used and a non-halogen gas, such as an oxygen gas or a hydrogen gas, may be contained to accelerate a reaction.

TABLE 1

| Material | Boling point of halogen-based compound (° C.) | |
| --- | --- | --- |
| | Fluorine base | Chlorine base |
| Sn | 705 | 114.1 |
| In | >1200 | 300 |
| Ta | 229.5 | 242 |
| Si | −18.9 | 145 |
| Sb | 150 | 283 |
| Ir | 53 | — |
| Os | 45.9 | 450 |
| Re | 33.8 | — |
| Cr | 400 | 117 |
| W | 17.5 | 275.6 |
| Ge | −36.6 | 84 |
| As | 63 | 130 |
| V | 48.3 | 148.5 |
| Se | −46.6 | 196 |
| Ti | 284 | 136.4 |
| Mo | 35 | 268 |
| Al | — | 182.7 |

The optical characteristic required for photomasks is, first of all, a mask contrast in realizing the transfer by projection exposure without being limited to EUV exposure. In common, the mask contrast is evaluated by Expression (1) below in a transmissive mask, when the transmittance when light transmits through a transparent substrate part is set as T0 and the transmittance when light transmits through a pattern part including a light shielding film is set as T.

$$OD = -\log(T/T0) \quad (1)$$

Herein, OD is referred to as "Optical Density" and represents the degree of the light shielding property of the light shielding film.

The mask contrast can be similarly evaluated also in the EUV mask. When the reflectance by a high-reflection part containing a multi-layer reflective film 12 and the protective film 13 is set as R0 and the reflectance from a low-reflectance part containing the absorption film pattern 14a is set as R (see FIG. 2), the mask contrast is evaluated by Expression (2) below in the same manner as in the transmissive mask.

$$OD = -\log(R/R0) \quad (2)$$

In the reflective photomask blank 10 and the reflective photomask 20, generally, the higher the OD value, the better. The EUV light reflectance illustrated in FIG. 4 and the OD values illustrated in FIG. 5 are individually calculated using the optical constants (refractive index and extinction coefficient) and the film thickness of each layer for the reflective photomask blank 10 including the capping layer (protective layer) 3 formed of Ru having a thickness of 2.5 nm under the absorption film 4, the multi-layer reflective film 2 in which a plurality (e.g., 40 pairs) of multi-layer films containing a pair of Si and Mo is deposited under the capping layer 3, a flat synthetic quartz substrate (substrate 1) under the multi-layer reflective film 2, and a back surface conductive film containing a chromium nitride (CrN) layer on the back surface of the synthetic quartz substrate. More specifically, the OD value is calculated based on the configuration in which the back surface conductive film is provided on the back surface of the substrate 1 of each of the reflective photomask blank 10 illustrated in FIG. 1 and the reflective photomask 20 illustrated in FIG. 2. However, the materials or the film thicknesses of the multi-layer reflective films 2, 12, the capping layers 3, 13, the back surface conductive film, and the substrates 1, 11 of the reflective photomask blank 10 and the reflective photomask 20 are not limited thereto.

Figure 4:
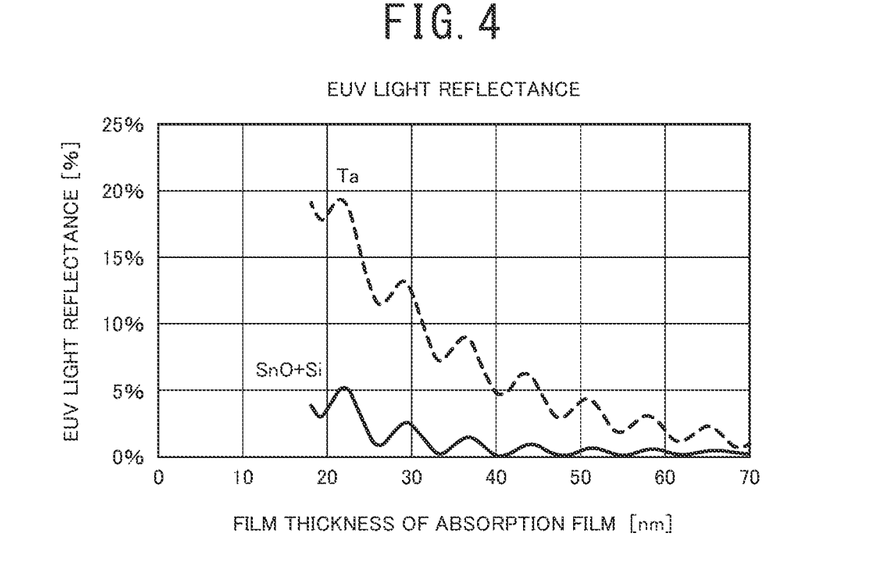
FIG. 4 is a graph illustrating a simulation result of the reflectance in the EUV light of the reflective photomask blank according to the embodiment of the present invention.
Figure 5:
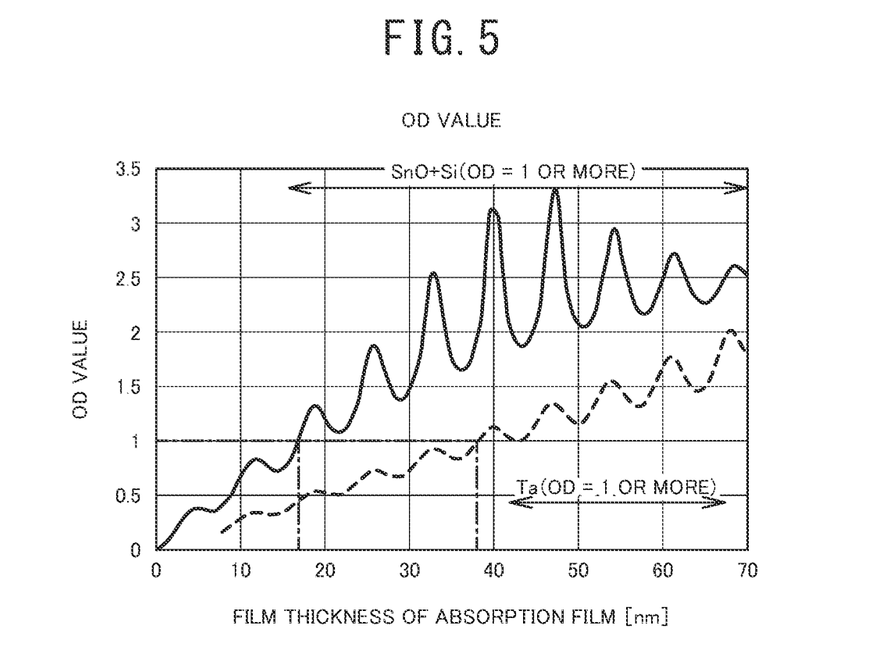
FIG. 5 is a graph illustrating a simulation result of OD values at the wavelength of the EUV light of the reflective photomask blank according to the embodiment of the present invention.

As is understood from FIG. 4, a tin oxide (SnO) film containing silicon (Si) can significantly lower the EUV light reflectance in comparison with a tantalum (Ta) film in the case of the same film thickness, for example. The tin oxide (SnO) film containing silicon (Si) can significantly reduce the film thickness in comparison with the tantalum (Ta) film in the case of the same reflectance. Thus, the tin oxide (SnO) film containing tantalum (Ta) is effective as a constituent element constituting a high absorption film at the wavelength of the EUV light.

As is understood from FIG. 5, the tantalum (Ta) film requires a film thickness of at least about 40 nm to obtain the OD value of 1 or more, whereas the tin oxide (SnO) film containing silicon (Si) may have a film thickness of about 18 nm. Thus, it is found that the tin oxide (SnO) film containing silicon (Si) is effective as a constituent component capable of reducing the entire thickness of the absorption film 4 as compared with the tantalum (Ta) film also from the viewpoint of the OD value.

To obtain the OD value of 2 or more, the tantalum (Ta) film requires a film thickness of at least about 70 nm, whereas the tin oxide (SnO) film containing silicon (Si) may have a film thickness of 33 nm. Thus, it is found that the tin oxide (SnO) film containing silicon (Si) is effective as a constituent component capable of reducing the entire thickness of the absorption film 4 as compared with the tantalum (Ta) film even at the OD value of 2 or more. In conventional absorption films, a tantalum (Ta) film with a film thickness of about 70 nm (OD value of 2) is typically used.

Thus, the use of the tin oxide (SnO) film containing silicon (Si) as the absorption film 4 (absorption film pattern 14a) enables a thickness reduction of the absorption film 4

(absorption film pattern 14a) while maintaining the OD value indicating the basic performance of the reflective photomask blank 10 and the reflective photomask 20.

Next, to evaluate the influence of the shadowing effect, how an HV bias value changes when the film thickness is varied is compared by a simulation between each of the tantalum (Ta) film and the tin oxide (SnO) film containing silicon (Si). The HV bias value is a line width difference of a transfer pattern depending on the direction of the mask pattern, i.e., a difference between the line width in the horizontal (H) direction and the line width in the vertical (V) direction. The line width in the H direction indicates the line width of a line pattern orthogonal to the plane formed by an incident light and a reflected light (hereinafter sometimes referred to as "incident plane"). The line width in the V direction indicates the line width of a line pattern parallel to the incident plane. More specifically, the line width in the H direction is the length in the direction parallel to the incident plane. The line width in the V direction is the length in the direction orthogonal to the incident plane.

It is the line width in the H direction that is influenced by the shadowing effect, and a contrast reduction at an edge part of a transferred pattern or a line width reduction in the H direction occurs. In a pattern influenced by the shadowing effect, the line width after transfer is smaller than the desired line width. On the other hand, the line width in the V direction is hardly influenced by the shadowing effect. Therefore, a line width difference (HV bias) arises between the line width of the transfer pattern in the direction perpendicular to the incident plane and the line width of the transfer pattern in the direction parallel to the incident plane.

Herein, when the HV bias values of the existing tantalum (Ta) film (film thickness of 60 nm) and the tin oxide (SnO) film (film thickness of 26 nm) containing silicon (Si) are compared, the HV bias value is as large as 7.3 nm in the tantalum (Ta) film, whereas the HV bias value can be significantly reduced to 4.0 nm and improved in the tin oxide (SnO) film containing silicon (Si) as shown in Table 2. Thus, it is found that the influence (HV bias) of the shadowing effect can be significantly reduced by the use of the tin oxide (SnO) film containing silicon (Si) for a formation material of the absorption film 4 (absorption film pattern 14a) in the reflective photomask blank 10 and the reflective photomask 20 of this embodiment.

As described above, the materials used for the absorption film 4 (absorption film pattern 14a) are desirably oxides rather than single substances to impart thermal resistance. To impart thermal resistance, a state in which a simple substance and oxygen are certainly bonded is required. More specifically, the tin oxide (SnO) film and the indium oxide (InO) film used for the absorption film 4 (absorption film pattern 14a) of this embodiment are preferably a tin oxide (SnO) film in which the atomic number ratio (O/Sn) of oxygen (O) to tin (Sn) is 1.5 or more and 2.5 or less and an indium oxide (InO) film in which the atomic number ratio (O/In) of oxygen (O) to indium (In) is 1.0 or more and 2.0 or less, respectively.

Figure 6:
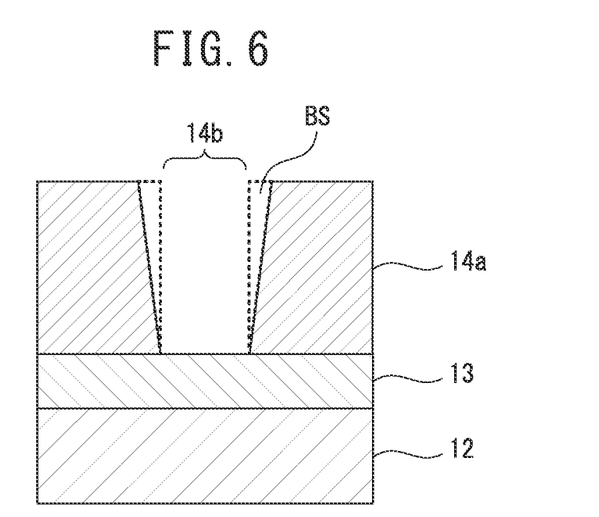
FIG. 6 is a schematic cross-sectional view illustrating side etching after a single-layer absorption film containing tin oxide has been subjected to electron beam repair etching.

FIG. 6 is a schematic cross-sectional view illustrating the absorption film pattern 14a after electron beam repair etching treatment when the reflective photomask 20 was produced using tin oxide (SnO) selected as a main component (formation material) forming the absorption film 14.

In the electron beam repair etching, a place to be etched is irradiated with an electron beam while supplying an etching gas, such as a fluorine-based gas ($XeF_2$), so that the reactivity of a fluorine etchant is accelerated, and tin oxide (SnO) is etched. However, tin oxide (SnO) has strong etching resistance against the fluorine-based gas, and thus requires an extremely long time for etching, and therefore damage is sometimes generated perpendicularly to the etching direction, which is referred to as side etching BS indicated by 14b in FIG. 6. When the side etching BS is large, the line width of the place subjected to the electron beam repair etching is significantly shifted, and therefore the fact that the etching resistance against an etching gas is strong, and thus an extremely long time is required for etching is one of the causes of a failure in the repair.

Therefore, the use of tin oxide (SnO) containing a material easy to be etched by a fluorine-based gas, i.e., a material in which the boiling point of a fluorine-based compound is 250° C. or less, as the absorption film 4 (absorption film pattern 14a) can improve the repair etching rate and can suppress the side etching BS to 2 nm or less, and therefore can improve the success rate of the electron beam repair etching. Therefore, it can be said that a material in which the repair side etching BS by a fluorine-based gas is 2 nm or less has a high repair etching rate. The same applies also to a case of using indium oxide (InO) as the absorption film 4 (absorption film pattern 14a).

When the protective film 13 as the base is etched in the electron beam repair etching by a fluorine-based gas, the electron beam repair etching by a chlorine-based gas (NOCl) is usable. Indium oxide (InO) is hard to be etched by a chlorine-based gas, and therefore the side etching BS similarly sometimes occurs. In that case, the use of indium oxide (InO) containing a material easy to be etched by a chlorine-based gas, i.e., a material in which the boiling point of a chlorine-based compound is 250° C. or less, as the absorption film 4 (absorption film absorption film pattern 14a) can improve the repair etching rate and can suppress the side etching BS, and therefore can improve the success rate of the electron beam repair etching.

Materials to be mixed with the absorption film 4 (absorption film pattern 14a) are desirably materials which can be subjected to the electron beam repair etching by a fluorine-based gas or a chlorine-based gas, i.e., the boiling point of a fluorine-based compound or a chlorine-based compound is 250° C. or less, to achieve the above-described etching process. Specifically, as shown in Table 1, mixed materials easy to be etched by a fluorine-based gas are desirably silicon, antimony, iridium, osmium, rhenium, tungsten, germanium, arsenic, vanadium, selenium, molybdenum, and tantalum. Mixed materials easy to be etched by a chlorine-based gas are desirably silicon, chromium, germanium, arsenic, vanadium, titanium, tantalum, aluminum, and the like. Further, oxides, nitrides, oxynitrides, or boron nitrides of these mixed materials may be used. As an etching gas, a mixed gas of a fluorine-based gas and a chlorine-based gas may be used.

As described above, the absorption film 4 (absorption film pattern 14a) according to this embodiment contains a material having a higher repair etching rate in the electron beam repair than the repair etching rate in the electron beam repair of an absorption film (absorption film pattern) containing only at least one of tin oxide (SnO) and indium oxide (InO). Herein, the "material having a high repair etching rate in the electron beam repair" means the "material which can be subjected to the electron beam repair etching by a fluorine-based gas or a chlorine-based gas" described above.

When the use of the above-described mixed material causes such a harmful effect that the resistance against chemical solutions, such as SPM (Sulfuric acid-Hydrogen peroxide mixture) and APM (Ammonia-Hydrogen peroxide mixture) which are generally used for mask cleaning, decreases, and the absorption film surface is roughened, so that the reflectance is adversely affected, for example, an about 1 to 5 nm cleaning-resistant layer may be provided on the absorption film 4 (absorption film pattern 14a). As another method, a cleaning-resistant coating film may be provided to cover the absorption film 4 (absorption film pattern 14a) or the capping layers 3, 13 exposed to the mask surface.

Examples of materials used for the cleaning-resistant layer or coating film include materials containing at least one of compounds, such as $SiO_2$, SiON, TaO, TaN, TaBN, CrN, CrON, CrO, and $TiO_2$.

Example 1

Hereinafter, Examples are described with respect to the reflective photomask blank and the photomask according to present invention with reference to the drawings and tables.

Figure 7:
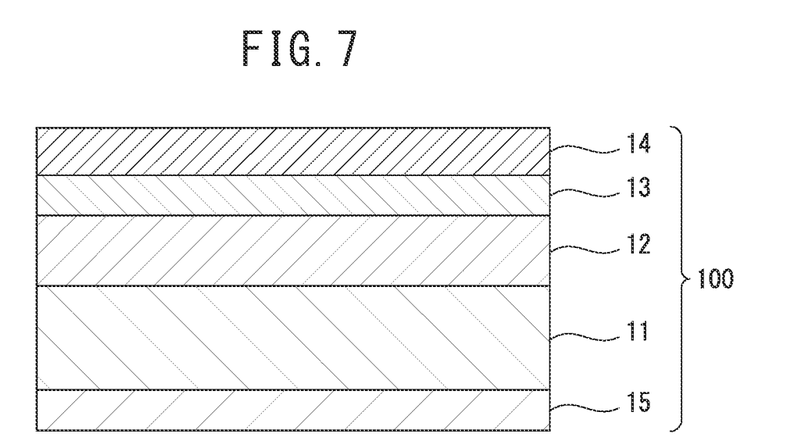
FIG. 7 is a schematic cross-sectional view illustrating the structure of a reflective photomask blank according to Examples of the present invention.

As illustrated in FIG. 7, the multi-layer reflective film 12 formed by depositing 40 multi-layer films each containing a pair of silicon (Si) and molybdenum (Mo) was formed on the synthetic quartz substrate 11 having low thermal expansion characteristics. The film thickness of the multi-layer reflective film 12 was set to 280 nm.

Next, the capping layer 13 formed of ruthenium (Ru) was formed as an intermediate film such that the film thickness was 2.5 nm on the multi-layer reflective film 12. Thus, a reflection part having the multi-layer reflective film 12 and the capping layer 13 is formed on the substrate 11. On the capping layer 13, the absorption film 14 formed of tin oxide (SnO) and silicon (Si) was formed such that film thickness was 26 nm. The atomic number ratio among tin (Sn), oxygen (O), and silicon (Si) was 31.7:63.3:5.0 as measured by the XPS (X-ray photoelectron spectroscopy). The measurement by an XRD (X-ray diffraction device) showed that the absorption film 14 was amorphous although crystallinity was slightly observed.

Next, on the side where the multi-layer reflective film 12 was not formed of the substrate 11, a back surface conductive film 15 formed of chromium nitride (CrN) was formed with a thickness of 100 nm, so that a reflective photomask blank 100 was prepared.

For the formation of each film on the substrate 11, a multi-source sputtering apparatus was used. The film thickness of each film was controlled by a sputtering time.

The tin oxide (SnO) film containing silicon (Si) described above was measured for reflectance R0 in a reflective layer region and reflectance R in an absorption film region with a reflectance measuring device by the EUV light. From the measurement results, the OD value, which is the mask characteristic, was calculated. As a result, it was found that the reflective photomask blank 100 was able to be produced such that the EUV reflectance was 0.08% and the OD value was 2.9 as shown in Table 2.

Figure 8:
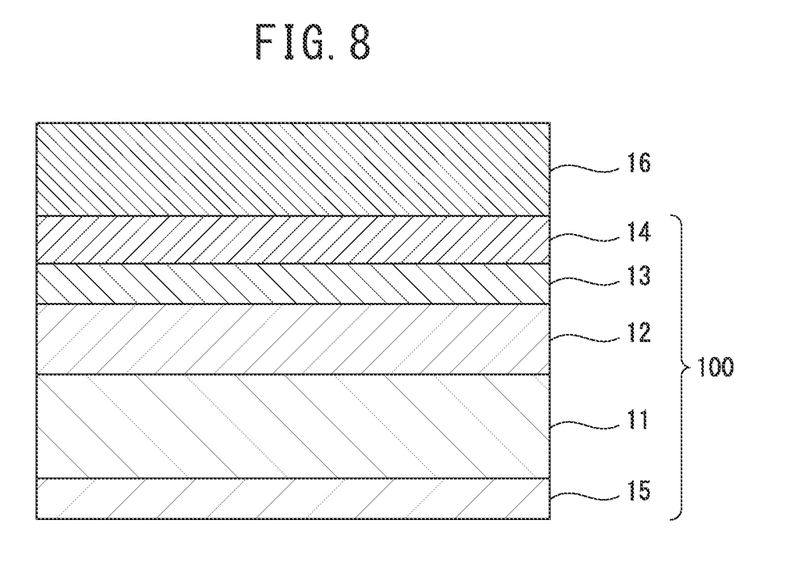
FIG. 8 is a schematic cross-sectional view illustrating a manufacturing step of a reflective photomask according to Examples of the present invention.
Figure 9:
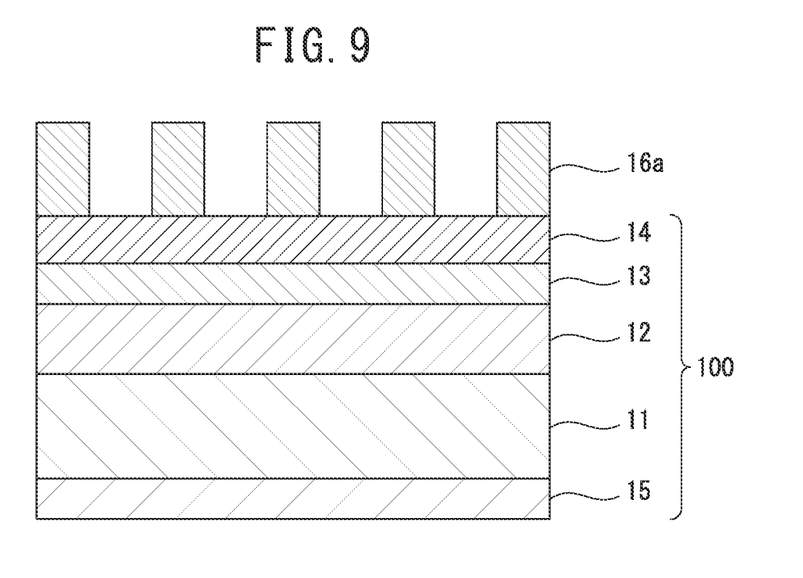
FIG. 9 is a schematic cross-sectional view illustrating a manufacturing step of the reflective photomask according to Examples of the present invention.
Figure 10:
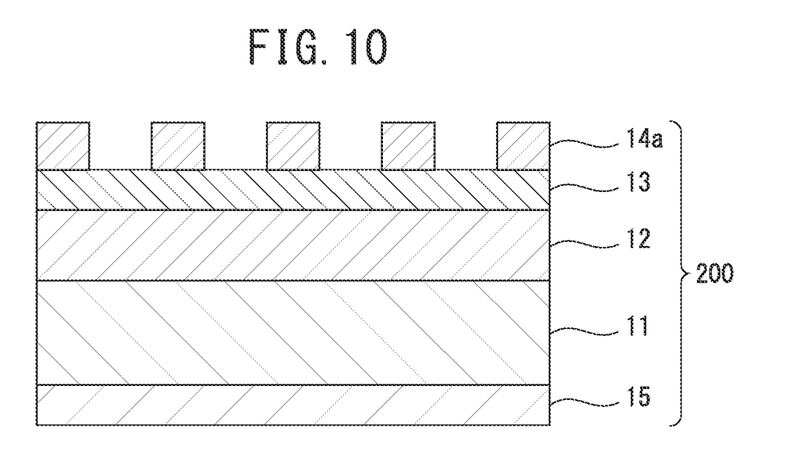
FIG. 10 is a schematic cross-sectional view illustrating a manufacturing step of the reflective photomask according to Examples of the present invention.

Next, a method for producing a reflective photomask 200 is described using FIGS. 8 to 10.

As illustrated in FIG. 8, a positive chemically amplified resist (SEBP9012: manufactured by Shin-Etsu Chemical Co., Ltd.) was formed by spin coating to have a film thickness of 120 nm on the absorption film 14 provided on the reflective photomask blank 100, and then baked at 110° C. for 10 min to form a resist film 16.

Next, a predetermined pattern was drawn on the resist film 16 formed of the positive chemically amplified resist by an electron beam lithography machine (JBX3030: manufactured by JEOL). Thereafter, baking treatment was performed at 110° C. for 10 minutes, followed by spray development (SFG3000: manufactured by Sigma Meltec). This formed a resist pattern 16a as illustrated in FIG. 9.

Next, as illustrated in FIG. 9, the absorption film 14 was patterned mainly by dry etching using a mixed gas containing a fluorine-based gas and a chlorine-based gas with the resist pattern 16a as an etching mask, so that the absorption film pattern 14a was formed. Herein, the etching selectivity (resist selectivity) for the resist film 16 was calculated. Then, a case where the selectivity was improved in comparison with an existing 100% tin oxide (SnO) film or 100% indium oxide (InO) film was evaluated as "○" and a case where the selectivity deteriorated was evaluated as "x". A comparison target is the same film as the film of the main component.

As shown in Table 2, it was found that the resist selectivity of the blank was improved as compared with the 100% tin oxide (SnO) film.

Next, the remaining resist pattern 16a was peeled off, the absorption film pattern 14a was formed, and the reflective photomask 200 of Example 1 was produced as illustrated in FIG. 10. In Example 1, the absorption film pattern 14a formed by the absorption film 14 functioning as a low reflective layer was set to an LS (line and space) pattern having a line width of 64 nm. The LS pattern having a line width of 64 nm was designed in each of the x-direction and the y-direction such that the influence of the shadowing effect by the EUV irradiation can be easily seen.

The absorption film pattern 14a of the reflective photomask 200 produced in each of Examples and Comparative Examples described below was transferred and exposed onto a semiconductor wafer coated with an EUV positive chemically amplified resist using an EUV exposure device (NXE3300B: manufactured by ASML). At this time, the exposure amount was adjusted such that the LS pattern in the x-direction was transferred as designed. The observation and the line width measurement of the transferred resist pattern were carried out with an electron beam dimension measuring machine, and the resolution and the HV bias were confirmed. More specifically, in Example 1, the evaluation was performed based on the size (Large or Small) of the HV bias in comparison with a case where the LS pattern in the y-direction was properly transferred and an existing tantalum (Ta) mask was used. More specifically, a case where the LS pattern in the y-direction was transferred as designed in a state where the exposure amount was adjusted such that the LS pattern in the x-direction was transferred as designed and the HV bias was smaller than that when the existing tantalum (Ta) mask was used was evaluated as "Pass". A case where the LS pattern in the y-direction was not transferred as designed (LS pattern in the y-direction was not resolved) or a case where the HV bias is larger than that when the existing tantalum (Ta) mask was used was evaluated as "Failure". As shown in Table 2, the LS pattern dimension in the y-direction was 12.0 nm to the designed value of 16.0 nm and the HV bias was 4.0 nm. More specifically, the reflective photomask 200 of Example 1 had pattern transferability having no problems in use.

The above-described "existing tantalum (Ta) mask" is described as "Reference Example" in Table 2.

Figure 11:
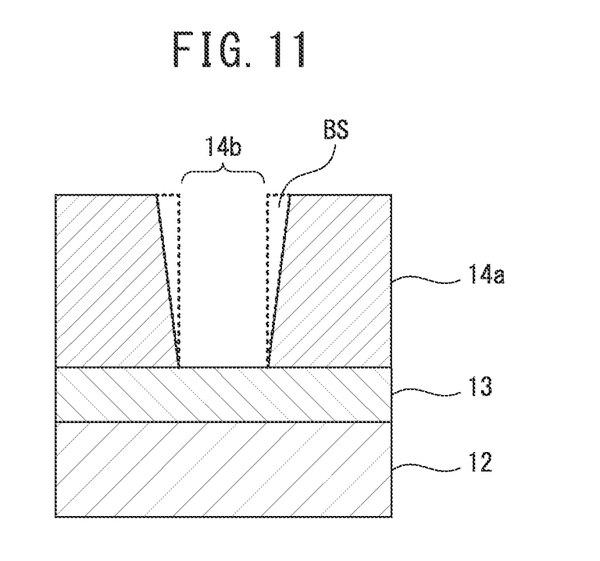
FIG. 11 is a schematic cross-sectional view illustrating a repair step of the reflective photomask according to Examples of the present invention.

FIG. 11 illustrates a partially enlarged view of the absorption film pattern 14a in the reflective photomask 200. Herein, a specific technique when the electron beam repair etching is applied to the formed absorption film pattern 14a by dry etching treatment using the resist pattern 16a is described. First, the absorption film pattern 14a as the outermost layer was irradiated with an electron beam in a gas atmosphere containing a mixture of a fluorine-based gas and oxygen to be subjected to the electron beam repair etching using an electron beam repair system (MeRiT MG45: manufactured by CarlZeiss). For the fluorine gas flow rate at this time, a cold trap technology was used in which the flow rate was controlled by temperatures. The temperature of fluorine was set to −26° C. (hereinafter referred to as a control temperature) and the temperature of oxygen was set to −43° C. The side etching BS at that time was confirmed to be less than 1 nm by measuring the line width with SEM (LWM9045: manufactured by ADVANTEST CORPORATION).

In the column of "Determination" of Table 2, a case where the superiority was able to be found in terms of both the OD value and the transferability as compared with the existing tantalum (Ta) mask was indicated as "○", a case where the superiority was not able to be found in terms of at least one of the OD value and the transferability as compared with the existing tantalum (Ta) mask was indicated as "Δ", and a case where the reflective photomask 200 was inferior in at least one of the OD value and the transferability to the existing tantalum (Ta) mask was indicated as "x".

designed value of 16.0 nm and the HV bias was 5.3 nm. More specifically, the reflective photomask 200 of Example 2 had pattern transferability having no problems in use.

In the electron beam etching repair, the control temperature of the fluorine gas flow rate was set to −20° C. and the control temperature of oxygen was set to −43° C. It was confirmed that the side etching BS at that time was less than 1 nm.

Comparative Example 1

The absorption film 14 was formed of tin oxide (SnO) and silicon (Si) such that the film thickness was 45 nm. The atomic number ratio among tin (Sn), oxygen (O), and silicon (Si) was 10.0:20.0:70.0 as measured by the XPS (X-ray photoelectron spectroscopy). Formation methods of the other films and a mask production method are the same as those of Example 1. The etching selectivity (resist selectivity) to the resist film 16 was found to be better than that of the 100% tin oxide (SnO) film by calculation.

TABLE 2

| | Composition | Film thickness | Reflectance | OD value | Resist selectivity | x-direction dimension (nm) | y-direction dimension (nm) | HV bias (nm) | BS 2 mm or less | Determination |
|---|---|---|---|---|---|---|---|---|---|---|
| Example 1 | Sn + O (1:2) 95% Si 5% | 26 | 0.08 | 2.9 | ○ | 16.0 | 12.0 | 4.0 | ○ | ○ |
| Example 2 | Sn + O (1:2) 50% Si 50% | 45 | 1.80 | 1.6 | ○ | 16.0 | 10.7 | 5.3 | ○ | ○ |
| Comparative Example 1 | Sn + O (1:2) 30% Si 70% | 45 | 5.07 | 1.1 | ○ | 16.0 | 12.9 | 3.1 | ○ | Δ |
| Example 3 | In + O (2:3) 95% Mo 5% | 27 | 0.97 | 1.8 | ○ | 16.0 | 11.5 | 4.5 | ○ | ○ |
| Example 4 | In + O (2:3) 60% Mo 40% | 34 | 2.32 | 1.4 | ○ | 16.0 | 11.0 | 5.0 | ○ | ○ |
| Comparative Example 2 | In + O (2:3) 60% Mo 40% | 42 | 1.02 | 1.8 | ○ | 16.0 | 7.0 | 9.0 | ○ | x |
| Comparative Example 3 | In + O (2:3) 60% Mo 40% | 50 | 0.68 | 2.0 | ○ | 16.0 | — | — | ○ | x |
| Comparative Example 4 | In + O (2:3) 40% Mo 60% | 45 | 6.55 | 1.0 | ○ | 16.0 | 6.4 | 9.6 | ○ | x |
| Reference Example | TaO 2 nm TaN 58 nm | 60 | 1.83 | 1.5 | ○ | 16.0 | 8.7 | 7.3 | ○ | Δ |

Example 2

The absorption film 14 was formed of tin oxide (SnO) and silicon (Si) such that the film thickness was 45 nm. The atomic number ratio among tin (Sn), oxygen (O), and silicon (Si) was 16.7:33.3:50.0 as measured by the XPS (X-ray photoelectron spectroscopy). Formation methods of the other films and a mask production method are the same as those of Example 1. The etching selectivity (resist selectivity) to the resist film 16 was found to be better than that of the 100% tin oxide (SnO) film by calculation.

As a result of performing the measurement with a reflectance measuring device by the EUV light and calculating the OD value as the mask characteristic, it was found that the reflective photomask 200 was able to be produced such that the EUV reflectance was 1.8% and the OD value was 1.6 as shown in Table 2.

In the transferability evaluation by the EUV exposure, the LS pattern dimension in the y-direction was 10.7 nm to the designed value of 16.0 nm and the HV bias was 3.1 nm.

In the electron beam etching repair, the control temperature of the fluorine gas flow rate was set to −20° C. and the control temperature of oxygen was set to −43° C. It was confirmed that the side etching BS at that time was less than 1 nm.

As a result of performing the measurement with a reflectance measuring device by the EUV light and calculating the OD value as the mask characteristic, it was found that the reflective photomask 200 was able to be produced such that the EUV reflectance was 5.1% and the OD value was 1.1 as shown in Table 2. More specifically, the EUV light reflectance was higher than that of the existing tantalum (Ta) mask.

In the transferability evaluation by the EUV exposure, the LS pattern dimension in the y-direction was 12.9 nm to the designed value of 16.0 nm and the HV bias was 3.1 nm.

In the electron beam etching repair, the control temperature of the fluorine gas flow rate was set to −20° C. and the control temperature of oxygen was set to −43° C. It was confirmed that the side etching BS at that time was less than 1 nm.

Example 3

The absorption film 14 was formed of indium oxide (InO) and molybdenum (Mo) such that the film thickness was 27 nm. The atomic number ratio among indium (In), oxygen (O), and molybdenum (Mo) was 38.0:57.0:5.0 as measured by the XPS (X-ray photoelectron spectroscopy). Formation methods of the other films and a mask production method are the same as those of Example 1. The etching selectivity (resist selectivity) to the resist film 16 was found to be better than that of the 100% indium oxide (InO) film by calculation.

As a result of performing the measurement with a reflectance measuring device by the EUV light and calculating the OD value as the mask characteristic, it was found that the reflective photomask 200 was able to be produced such that the EUV reflectance was 1.0% and the OD value was 1.8 as shown in Table 2.

In the transferability evaluation by the EUV exposure, the LS pattern dimension in the y-direction was 11.5 nm to the designed value of 16.0 nm and the HV bias was 4.5 nm. More specifically, the reflective photomask 200 of Example 3 had pattern transferability having no problems in use.

In the electron beam etching repair, the control temperature of the fluorine gas flow rate was set to −20° C. and the control temperature of oxygen was set to −43° C. It was confirmed that the side etching BS at that time was less than 1 nm.

Example 4

The absorption film 14 was formed of indium oxide (InO) and molybdenum (Mo) such that the film thickness was 34 nm. The atomic number ratio among indium (In), oxygen (O), and molybdenum (Mo) was 24.0:36.0:40.0 as measured by the XPS (X-ray photoelectron spectroscopy). Formation methods of the other films and a mask production method are the same as those of Example 1. The etching selectivity (resist selectivity) to the resist film 16 was found to be better than that of the 100% indium oxide (InO) film by calculation.

As a result of performing the measurement with a reflectance measuring device by the EUV light and calculating the OD value as the mask characteristic, it was found that the reflective photomask 200 was able to be produced such that the EUV reflectance was 2.3% and the OD value was 1.4 as shown in Table 2.

In the transferability evaluation by the EUV exposure, the LS pattern dimension in the y-direction was 11.0 nm to the designed value of 16.0 nm and the HV bias was 5.0 nm. More specifically, the reflective photomask 200 of Example 4 had pattern transferability having no problems in use.

In the electron beam etching repair, the control temperature of the fluorine gas flow rate was set to −20° C. and the control temperature of oxygen was set to −43° C. It was confirmed that the side etching BS at that time was less than 1 nm.

Comparative Example 2

The absorption film 14 was formed of indium oxide (InO) and molybdenum (Mo) such that the film thickness was 42 nm. The atomic number ratio among indium (In), oxygen (O), and molybdenum (Mo) was 24.0:36.0:40.0 as measured by the XPS (X-ray photoelectron spectroscopy). Formation methods of the other films and a mask production method are the same as those of Example 1. The etching selectivity (resist selectivity) to the resist film 16 was found to be better than that of the 100% indium oxide (InO) film by calculation.

As a result of performing the measurement with a reflectance measuring device by the EUV light and calculating the OD value as the mask characteristic, it was found that the reflective photomask 200 was able to be produced such that the EUV reflectance was 1.0% and the OD value was 1.8 as shown in Table 2.

In the transferability evaluation by the EUV exposure, the LS pattern dimension in the y-direction was 7.0 nm to the designed value of 16.0 nm and the HV bias was 9.0 nm. More specifically, the reflective photomask 200 of Comparative Example 2 was inferior in pattern transferability to the existing tantalum (Ta) mask, and the superiority was not able to be found.

In the electron beam etching repair, the control temperature of the fluorine gas flow rate was set to −20° C. and the control temperature of oxygen was set to −43° C. It was confirmed that the side etching BS at that time was less than 1 nm.

Comparative Example 3

The absorption film 14 was formed of indium oxide (InO) and molybdenum (Mo) such that the film thickness was 50 nm. The atomic number ratio among indium (In), oxygen (O), and molybdenum (Mo) was 24.0:36.0:40.0 as measured by the XPS (X-ray photoelectron spectroscopy). Formation methods of the other films and a mask production method are the same as those of Example 1. The etching selectivity (resist selectivity) to the resist film 16 was found to be better than that of the 100% indium oxide (InO) film by calculation.

As a result of performing the measurement with a reflectance measuring device by the EUV light and calculating the OD value as the mask characteristic, it was found that the reflective photomask 200 was able to be produced such that the EUV reflectance was 0.7% and the OD value was 2.0 as shown in Table 2.

In the transferability evaluation by the EUV exposure, the LS pattern dimension in the y-direction was not resolved to the designed value of 16.0 nm. More specifically, the reflective photomask 200 of Comparative Example 3 was inferior in pattern transferability to the existing tantalum (Ta) mask, and the superiority was not able to be found.

In the electron beam etching repair, the control temperature of the fluorine gas flow rate was set to −20° C. and the control temperature of oxygen was set to −43° C. It was confirmed that the side etching BS at that time was less than 1 nm.

Comparative Example 4

The absorption film 14 was formed of indium oxide (InO) and molybdenum (Mo) such that the film thickness was 45 nm. The atomic number ratio among indium (In), oxygen (O), and molybdenum (Mo) was 16.0:24.0:60.0 as measured by the XPS (X-ray photoelectron spectroscopy). Formation methods of the other films and a mask production method are the same as those of Example 1. The etching selectivity (resist selectivity) to the resist film 16 was found to be better than that of the 100% indium oxide (InO) film by calculation.

As a result of performing the measurement with a reflectance measuring device by the EUV light and calculating the OD value as the mask characteristic, it was found that the reflective photomask 200 was able to be produced such that the EUV reflectance was 6.6% and the OD value was 1.0 as shown in Table 2. More specifically, the EUV light reflectance was higher than that of the existing tantalum (Ta) mask.

In the transferability evaluation by the EUV exposure, the LS pattern dimension in the y-direction was 6.4 nm to the designed value of 16.0 nm and the HV bias was 9.6 nm. More specifically, the reflective photomask 200 of Comparative Example 4 was inferior in pattern transferability to the existing tantalum (Ta) mask, and the superiority was not able to be found.

In the electron beam etching repair, the control temperature of the fluorine gas flow rate was set to −20° C. and the control temperature of oxygen was set to −43° C. It was confirmed that the side etching BS at that time was less than 1 nm.

INDUSTRIAL APPLICABILITY

The reflective photomask according to the present invention can be suitably used to form a fine pattern by the EUV exposure in a manufacturing step of a semiconductor integrated circuit and the like.

REFERENCE SIGNS LIST 1 substrate
2 multi-layer reflective film
3 capping layer
4 absorption film
10 reflective photomask blank (reflective mask blank)
11 substrate
12 multi-layer reflective film
13 capping layer
14 absorption film
14a absorption film pattern
14b place to be subjected to electron beam repair etching in absorption film pattern
15 back surface conductive film
16 resist film
16a resist pattern
BS side etching
20 reflective photomask (reflective mask)
100 reflective photomask blank (reflective mask blank)
200 reflective photomask (reflective mask)

The invention claimed is:

1. A reflective mask blank comprising:
a substrate;
a reflective film configured to reflect an EUV light having a multi-layer structure formed on the substrate;
a protective film configured to protect the reflective film formed on the reflective film; and
an absorption film configured to absorb the EUV light formed on the protective film, wherein
the absorption film contains 50% by atom or more of elements constituting tin oxide or indium oxide and contains at least one selected from the group consisting of antimony, iridium, osmium, rhenium, tungsten, germanium, vanadium, selenium, molybdenum, titanium, and aluminum, and oxides, nitrides, oxynitrides, and boron nitrides thereof, as a material able to be etched by a fluorine-based gas or a chlorine-based gas.

2. The reflective mask blank according to claim 1, wherein
a film thickness of the absorption film is 45 nm or less, and
an OD value (Optical Density) is 1.0 or more.

3. The reflective mask blank according to claim 2, wherein
an atomic number ratio (O/Sn) of oxygen (O) to tin (Sn) in the absorption film is within a range of 1.5 or more and 2.5 or less, and
an atomic number ratio (O/In) of oxygen (O) to indium (In) in the absorption film is within a range of 1.0 or more and 2.0 or less.

4. The reflective mask blank according to claim 2, wherein the absorption film contains a material having a higher repair etching rate in electron beam repair than a repair etching rate in electron beam repair of an absorption film containing only at least one of tin oxide and indium oxide.

5. The reflective mask blank according to claim 1, wherein
an atomic number ratio (O/Sn) of oxygen (O) to tin (Sn) in the absorption film is within a range of 1.5 or more and 2.5 or less, and
an atomic number ratio (O/In) of oxygen (O) to indium (In) in the absorption film is within a range of 1.0 or more and 2.0 or less.

6. The reflective mask blank according to claim 1, wherein the absorption film contains a material having a higher repair etching rate in electron beam repair than a repair etching rate in electron beam repair of an absorption film containing only at least one of tin oxide and indium oxide.

7. A reflective mask comprising:
a substrate;
a reflective film configured to reflect an EUV light having a multi-layer structure formed on the substrate;
a protective film configured to protect the reflective film formed on the reflective film; and
an absorption film configured to absorb the EUV light formed on the protective film, wherein
the absorption film contains 50% by atom or more of elements constituting tin oxide or indium oxide and contains at least one selected from the group consisting of antimony, iridium, osmium, rhenium, tungsten, germanium, vanadium, selenium, molybdenum, titanium, and aluminum, and oxides, nitrides, oxynitrides, and boron nitrides thereof, as a material able to be etched by a fluorine-based gas or a chlorine-based gas.

8. The reflective mask according to claim 7, wherein
a film thickness of the absorption film is 45 nm or less, and
an OD value (Optical Density) is 1.0 or more.

9. The reflective mask according to claim 7, wherein
an atomic number ratio (O/Sn) of oxygen (O) to tin (Sn) in the absorption film is within a range of 1.5 or more and 2.5 or less, and
an atomic number ratio (O/In) of oxygen (O) to indium (In) in the absorption film is within a range of 1.0 or more and 2.0 or less.

10. The reflective mask according to claim 7, wherein the absorption film contains a material having a higher repair etching rate in electron beam repair than a repair etching rate in electron beam repair of an absorption film containing only at least one of tin oxide and indium oxide.

* * * * *